(12) United States Patent
Mizukami

(10) Patent No.: US 12,477,786 B2
(45) Date of Patent: Nov. 18, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Makoto Mizukami, Ibo Hyogo (JP)

(73) Assignees: Kabushiki Kaisha Toshiba, Kawasaki (JP); Toshiba Electronic Devices & Storage Corporation, Kawasaki (JP)

(*) Notice: Subject to any disclaimer, the term of this patent is extended or adjusted under 35 U.S.C. 154(b) by 631 days.

(21) Appl. No.: 17/859,790

(22) Filed: Jul. 7, 2022

(65) Prior Publication Data

US 2023/0282689 A1 Sep. 7, 2023

(30) Foreign Application Priority Data

Mar. 4, 2022 (JP) .................................. 2022-033237

(51) Int. Cl.
*H01L 29/06* (2006.01)
*H10D 30/66* (2025.01)
*H10D 62/10* (2025.01)
*H10D 62/832* (2025.01)
*H10D 64/27* (2025.01)

(52) U.S. Cl.
CPC ......... *H10D 62/102* (2025.01); *H10D 30/665* (2025.01); *H10D 30/668* (2025.01); *H10D 62/8325* (2025.01); *H10D 64/512* (2025.01)

(58) Field of Classification Search
CPC .. H10D 62/102; H10D 30/665; H10D 30/668; H10D 62/8325; H10D 64/512; H10D 30/66; H10D 12/031; H10D 62/393; H10D 62/157; H10D 62/111; H10D 62/107; H10D 30/63
See application file for complete search history.

(56) References Cited

U.S. PATENT DOCUMENTS

| 6,683,347 B1 * | 1/2004 | Fujihira | H10D 30/662 257/E29.198 |
|---|---|---|---|
| 7,041,560 B2 | 5/2006 | Hshieh | |
| 7,859,052 B2 | 12/2010 | Saito | |
| 8,907,420 B2 | 12/2014 | Saito et al. | |

(Continued)

FOREIGN PATENT DOCUMENTS

| JP | 2008-182054 A | 8/2008 |
|---|---|---|
| JP | 2009-004805 A | 1/2009 |

(Continued)

OTHER PUBLICATIONS

Office Action issued in Japanese Patent Application No. 2022-033237, dated Apr. 16, 2025 in 9 pages.

*Primary Examiner* — Cuong B Nguyen
(74) *Attorney, Agent, or Firm* — Knobbe, Martens, Olson & Bear, LLP

(57) ABSTRACT

The super junction structure part includes a plurality of n-type pillars having higher impurity concentrations than the second layer, a plurality of p-type pillars having higher impurity concentrations than the second layer, and a boundary region positioned between the n-type pillar and the p-type pillar in a second direction orthogonal to the first direction, the boundary region extending in the first direction continuously from the second layer, the boundary region having a lower impurity concentration than the n-type pillars and the p-type pillars.

16 Claims, 7 Drawing Sheets

(56) References Cited

U.S. PATENT DOCUMENTS

| | | |
|---|---|---|
| 9,859,361 B2 | 1/2018 | Schulze et al. |
| 2009/0273031 A1 | 11/2009 | Saito et al. |
| 2015/0108501 A1 | 4/2015 | Iwamuro et al. |
| 2018/0158899 A1* | 6/2018 | Niimura ............... H10D 30/668 |
| 2022/0020846 A1 | 1/2022 | Voerckel |
| 2023/0147932 A1* | 5/2023 | Tarui ................... H10D 30/665 257/77 |

FOREIGN PATENT DOCUMENTS

| | | |
|---|---|---|
| JP | 2009-272397 A | 11/2009 |
| JP | 2012-160752 A | 8/2012 |
| JP | 2016-192541 A | 11/2016 |
| JP | 2022-020573 A | 2/2022 |
| WO | WO 2013/161451 A1 | 10/2013 |

* cited by examiner

SEMICONDUCTOR DEVICE

CROSS-REFERENCE TO RELATED APPLICATION

This application is based upon and claims the benefit of priority from Japanese Patent Application No. 2022-033237, filed on Mar. 4, 2022; the entire contents of which are incorporated herein by reference.

FIELD

Embodiments described herein relate generally to a semiconductor device.

BACKGROUND

Known power devices include a vertical device that includes a structure of periodically-arranged p-type pillars and n-type pillars called a super junction structure. By setting the impurity amounts included in the p-type pillars and the n-type pillars to be about equal, the super junction structure can realize a low on-resistance by causing a current to flow through the n-type pillars while maintaining a high breakdown voltage due to the depletion of the drift region. Power devices that use silicon carbide (SIC) also are being developed. SiC devices need a different development approach from silicon devices.

DETAILED DESCRIPTION

Figure 1:
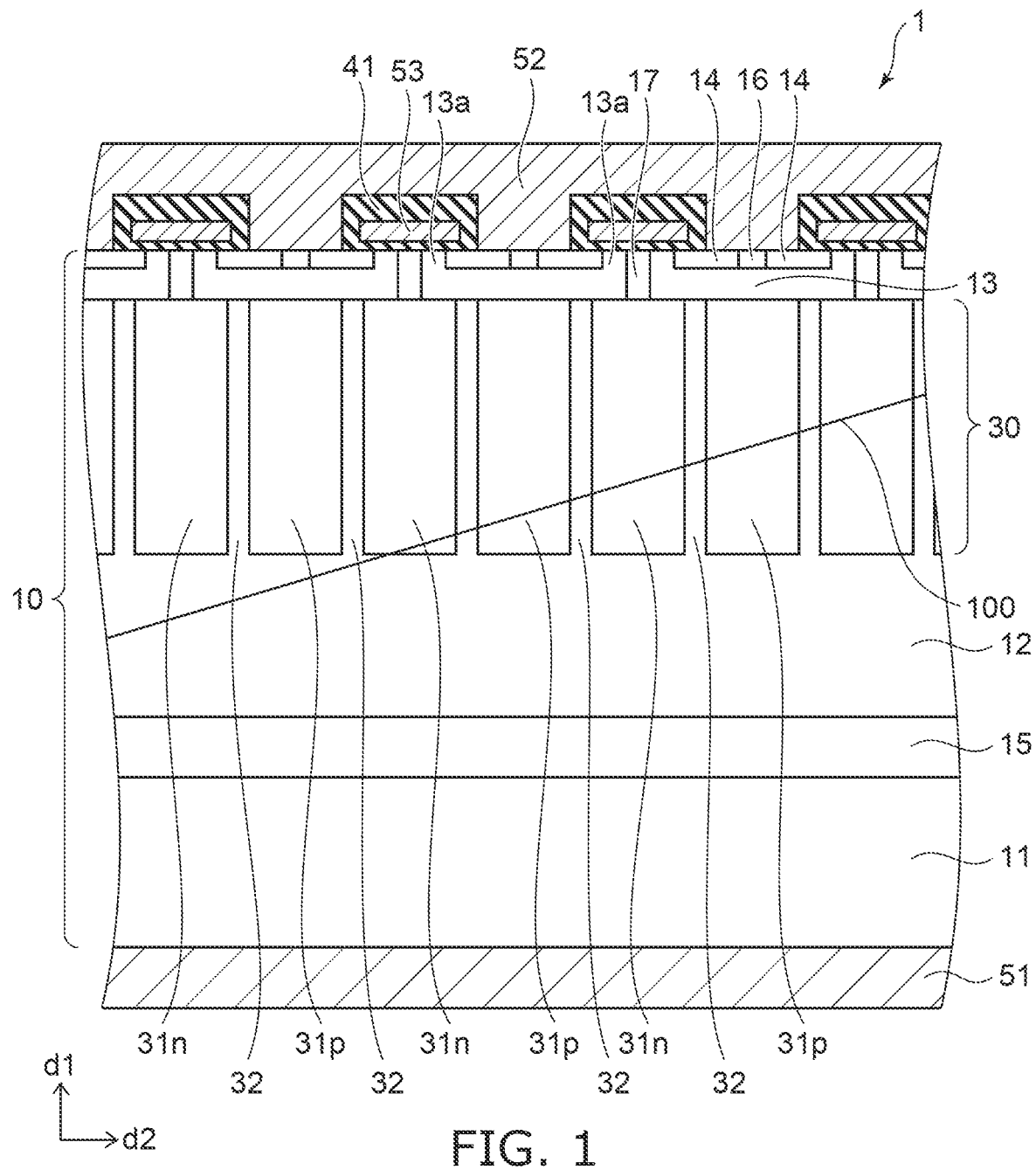
FIG. 1 is a schematic cross-sectional view of a semiconductor device of a first embodiment.

According to one embodiment, a semiconductor device includes a first electrode; a second electrode; and a silicon carbide layer located between the first electrode and the second electrode in a first direction. The silicon carbide layer includes a first layer electrically connected with the first electrode, the first layer being of an n-type, a second layer located on the first layer, the second layer being of the n-type and having a lower impurity concentration than the first layer, a super junction structure part located on the second layer, a third layer located on the super junction structure part, the third layer being of a p-type, and a fourth layer located on the third layer and electrically connected with the second electrode, the fourth layer being of the n-type. The super junction structure part includes a plurality of n-type pillars having higher impurity concentrations than the second layer, a plurality of p-type pillars having higher impurity concentrations than the second layer, and a boundary region positioned between the n-type pillar and the p-type pillar in a second direction orthogonal to the first direction, the boundary region extending in the first direction continuously from the second layer, the boundary region having a lower impurity concentration than the n-type pillars and the p-type pillars.

Embodiments will now be described with reference to the drawings. The same components in the drawings are marked with the same reference numerals.

First Embodiment

As shown in FIG. 1, a semiconductor device 1 of a first embodiment includes a first electrode 51, a second electrode 52, and a silicon carbide (SIC) layer 10. For example, the first electrode 51 functions as a drain electrode; and the second electrode 52 functions as a source electrode.

The direction from the first electrode 51 toward the second electrode 52 is taken as a first direction d1. The silicon carbide layer 10 is located between the first electrode 51 and the second electrode 52 in the first direction d1. In the first direction d1, the direction of the arrow is relatively up, and the direction of the opposite side of the arrow is relatively down.

The silicon carbide layer 10 includes an n-type first layer 11, an n-type second layer 12, a super junction structure part 30, a p-type third layer 13, and an n-type fourth layer 14.

The first layer 11 is a SiC substrate. The n-type impurity concentration of the first layer 11 is, for example, $1 \times 10^{20}/cm^3$. The first electrode 51 is located at the lower surface of the first layer 11; and the first layer 11 is electrically connected with the first electrode 51.

The second layer 12 is located on the first layer 11. The second layer 12 is epitaxially grown on the first layer (the SiC substrate) 11. Or, the second layer 12 may be located on the first layer 11 with an n-type fifth layer 15 interposed. The fifth layer 15 functions as a buffer layer of the epitaxial growth.

The n-type impurity concentration of the second layer 12 is less than the n-type impurity concentration of the first layer 11. The n-type impurity concentration of the second layer 12 is, for example, $1 \times 10^{17}/cm^3$. The n-type impurity concentration of the fifth layer 15 is less than the n-type impurity concentration of the first layer 11 and greater than the n-type impurity concentration of the second layer 12. The n-type impurity concentration of the fifth layer 15 is, for example, $1 \times 10^{18}/cm^3$.

The super junction structure part 30 is located on the second layer 12. The super junction structure part 30 includes multiple n-type pillars 31n and multiple p-type pillars 31p. The n-type pillar 31n and the p-type pillar 31p are alternately arranged in a second direction d2 orthogonal to the first direction d1. The lower end of the n-type pillar 31n and the lower end of the p-type pillar 31p contact the second layer 12. In the first direction d1, the second layer 12 and the n-type pillar 31n are in contact, and the second layer 12 and the p-type pillar 31p are in contact. The planar shapes of the n-type pillar 31n and the p-type pillar 31p are, for example, stripe shapes extending in a direction orthogonal to the first and second directions d1 and d2 (a direction extending through the page surface).

The n-type impurity concentration of the n-type pillar 31n is greater than the n-type impurity concentration of the second layer 12. The n-type impurity concentration of the n-type pillar 31n is, for example, $5 \times 10^{17}/cm^3$. The p-type impurity concentration of the p-type pillar 31p is greater than the n-type impurity concentration of the second layer 12. The p-type impurity concentration of the p-type pillar 31p is, for example, $5×10^{17}/cm^3$.

The n-type impurity concentration of the n-type pillar 31n and the p-type impurity concentration of the p-type pillar 31p are about equal. Also, the width in the second direction d2 of the n-type pillar 31n and the width in the second direction d2 of the p-type pillar 31p are substantially the same. Accordingly, the n-type impurity amount of the n-type pillar 31n and the p-type impurity amount of the p-type pillar 31p are about equal.

The super junction structure part 30 further includes multiple boundary regions 32. The boundary region 32 is positioned between the n-type pillar 31n and the p-type pillar 31p that are next to each other in the second direction d2; and the boundary region 32 extends in the first direction d1 continuously from the second layer 12. Similarly to the n-type pillar 31n and the p-type pillar 31p, the planar shape of the boundary region 32 is, for example, a stripe shape extending in a direction orthogonal to the first and second directions d1 and d2 (a direction extending through the page surface).

The boundary region 32 is, for example, an n-type region having about the same concentration as the second layer 12. The n-type impurity concentration of the boundary region 32 is less than the n-type impurity concentration of the n-type pillar 31n and the p-type impurity concentration of the p-type pillar 31p. The n-type impurity concentration of the boundary region 32 is, for example, $1×10^{17}/cm^3$.

Figure 2:
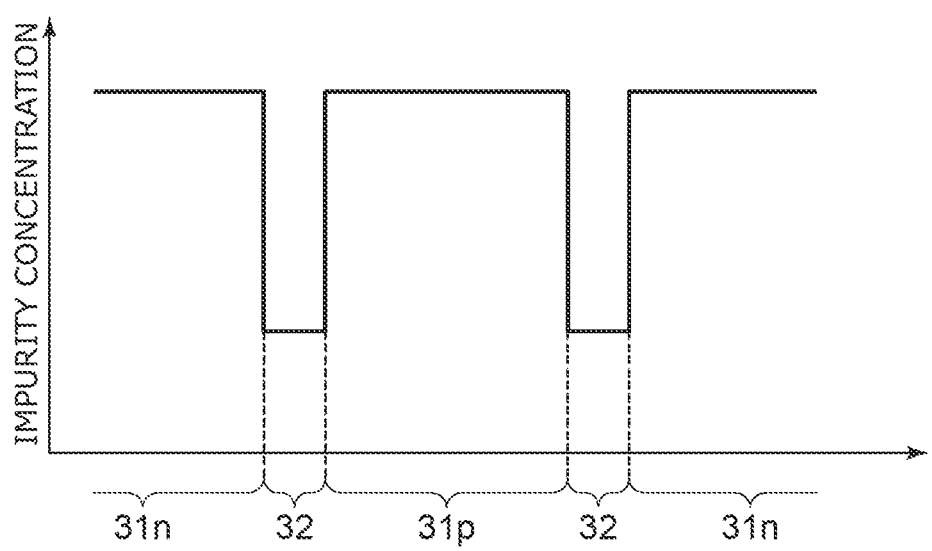
FIG. 2 is a schematic view showing an impurity concentration profile of a super junction structure part of embodiments.

As shown in FIG. 2, the boundary region 32 has an impurity concentration that is less than the n-type impurity concentration of the n-type pillar 31n and the p-type impurity concentration of the p-type pillar 31p and is substantially constant in the width direction (the second direction d2) between the n-type pillar 31n and the p-type pillar 31p.

The multiple third layers 13 are located on the super junction structure part 30. For example, the third layer 13 functions as a p-type base layer. The upper end of the p-type pillar 31p and the upper end of the boundary region 32 contact the third layer 13.

An n-type seventh layer 17 is located on the n-type pillar 31n. The seventh layer 17 contacts the n-type pillar 31n. The seventh layer 17 is positioned between the third layers 13 that are next to each other in the second direction d2.

The fourth layer 14 is located on the third layer 13. For example, the fourth layer 14 functions as an n-type source layer. The n-type impurity concentration of the fourth layer 14 is greater than the n-type impurity concentration of the n-type pillar 31n. The fourth layer 14 contacts the second electrode 52 and is electrically connected with the second electrode 52.

A p-type sixth layer 16 is located on the third layer 13. The p-type impurity concentration of the sixth layer 16 is greater than the p-type impurity concentration of the third layer 13 and the p-type impurity concentration of the p-type pillar 31p. The sixth layer 16 contacts the second electrode 52. The potential of the second electrode 52 is applied to the third layer 13 and the p-type pillar 31p via the sixth layer 16.

The semiconductor device 1 further includes a gate electrode 53 located on the silicon carbide layer 10. An insulating film 41 is located between the gate electrode 53 and the silicon carbide layer 10 and between the gate electrode 53 and the second electrode 52. For example, polycrystalline silicon can be used as the material of the gate electrode 53. The insulating film 41 is, for example, a silicon oxide film. The region (a channel region) 13a of the third layer 13 between the fourth layer 14 and the seventh layer 17 faces the gate electrode 53 via the insulating film 41.

In the on-operation of the semiconductor device 1, a potential that is not less than a threshold is applied to the gate electrode 53; and an inversion layer (an n-type channel) is formed in the channel region 13a. Then, an electron current flows between the second electrode 52 and the first electrode 51 via the fourth layer 14, the channel region 13a, the seventh layer 17, the n-type pillar 31n, the second layer 12, the fifth layer 15, and the first layer 11.

When the potential of the gate electrode 53 drops below the threshold, the n-type channel of the channel region 13a is cut off, and the semiconductor device 1 is switched to the off-state. In the off-state, a depletion layer spreads in the lateral direction (the second direction d2) in the super junction structure part 30 from the boundary region 32 between the n-type pillar 31n and the p-type pillar 31p; and the breakdown voltage of the semiconductor device 1 is maintained.

Because the second layer 12 that has a lower n-type impurity concentration than the first layer 11 is located between the first layer 11 and the super junction structure part 30, the depletion layer easily spreads from the boundary between the second layer 12 and the lower end of the p-type pillar 31p in the off-state. This depletion layer also increases the breakdown voltage of the semiconductor device 1.

Compared to a Si crystal, a defect 100 that crosses the boundary between the n-type pillar and the p-type pillar easily occurs in a SiC crystal. The impurity concentration profile may be steep at the boundary between the n-type pillar and the p-type pillar; and when the defect 100 crosses the boundary, a strong electric field is easily applied to defects at the boundary when the depletion layer spreads, which may cause breakdown.

According to the embodiment, by including the boundary region 32 that has an impurity concentration that is less than the n-type impurity concentration of the n-type pillar 31n and the p-type impurity concentration of the p-type pillar 31p and is substantially constant in the width direction (the second direction d2) between the n-type pillar 31n and the p-type pillar 31p, even when the defect 100 crosses the super junction structure part 30, the electric field that is applied to defects of the boundary region 32 can be relaxed, and the reliability of the semiconductor device 1 for high voltages can be increased.

The super junction structure part 30 can be formed by repeating ion implantation in the first direction d1 multiple times. After the second layer 12 is epitaxially grown on the first layer (the SiC substrate) 11, a p-type impurity is implanted into the region of the surface of the second layer 12 where the p-type pillar 31p is to be formed. For example, Al, B, and Ga can be used as the p-type impurity. Subsequently, an n-type impurity is implanted into the region of the surface of the second layer 12 where the n-type pillar 31n is to be formed. For example, N and P can be used as the n-type impurity. The p-type impurity may be implanted after implanting the n-type impurity.

After the first impurity implantation described above, a layer that includes a portion used to form the boundary region 32 (e.g., an n-type layer having about the same n-type impurity concentration as the second layer 12) is epitaxially grown on the impurity implantation region. A second impurity implantation into the epitaxial layer is performed similarly to the first impurity implantation described above. Thereafter, the process of epitaxially growing the layer including a portion used to form the boundary region 32 on the impurity implantation region and the process of implanting the impurities into the epitaxial layer are repeated a prescribed number of times. Subsequently, the n-type pillar 31n and the p-type pillar 31p are formed by diffusing the implanted impurities by performing heat treatment at, for example, a temperature of about 1900° C.

Impurities in SiC thermally diffuse less easily than impurities in Si; and the boundary region 32 that is a portion of the epitaxial layer described above is maintained between the n-type pillar 31n and the p-type pillar 31p. The boundary region 32 extends in the first direction continuously from the second layer 12.

Due to misalignment of the impurity implantation position, portions may occur at which a portion of the n-type pillar 31n and a portion of the p-type pillar 31p contact each other. For example, even if the implantation position of the p-type impurity shifts toward the left side in the second direction d2 of FIG. 1 at one location and a portion of the left side surface of the p-type pillar 31p thereby contacts the right side surface of the left-adjacent n-type pillar 31n, the spacing between the right side surface of the p-type pillar 31p and the right-adjacent n-type pillar 31n increases by the amount of the leftward shift of the p-type pillar 31p.

In other words, two side surfaces in the second direction d2 of the p-type pillar 31p do not contact the n-type pillars 31n; and at least one side surface among the two side surfaces in the second direction d2 of the p-type pillar 31p does not include a portion contacting the n-type pillar 31n. Similarly, two side surfaces in the second direction d2 of the n-type pillar 31n do not contact the p-type pillar 31p; and at least one side surface among the two side surfaces in the second direction d2 of the n-type pillar 31n does not include a portion contacting the p-type pillar 31p. Even if portions occur at which the n-type pillar 31n and the p-type pillar 31p contact each other, their numbers are few, and are not concentrated at specific locations.

Other embodiments will now be described. The configuration of the super junction structure part 30 according to the other embodiments is the same as that of the first embodiment; and same effects are obtained.

Second Embodiment

Figure 3:
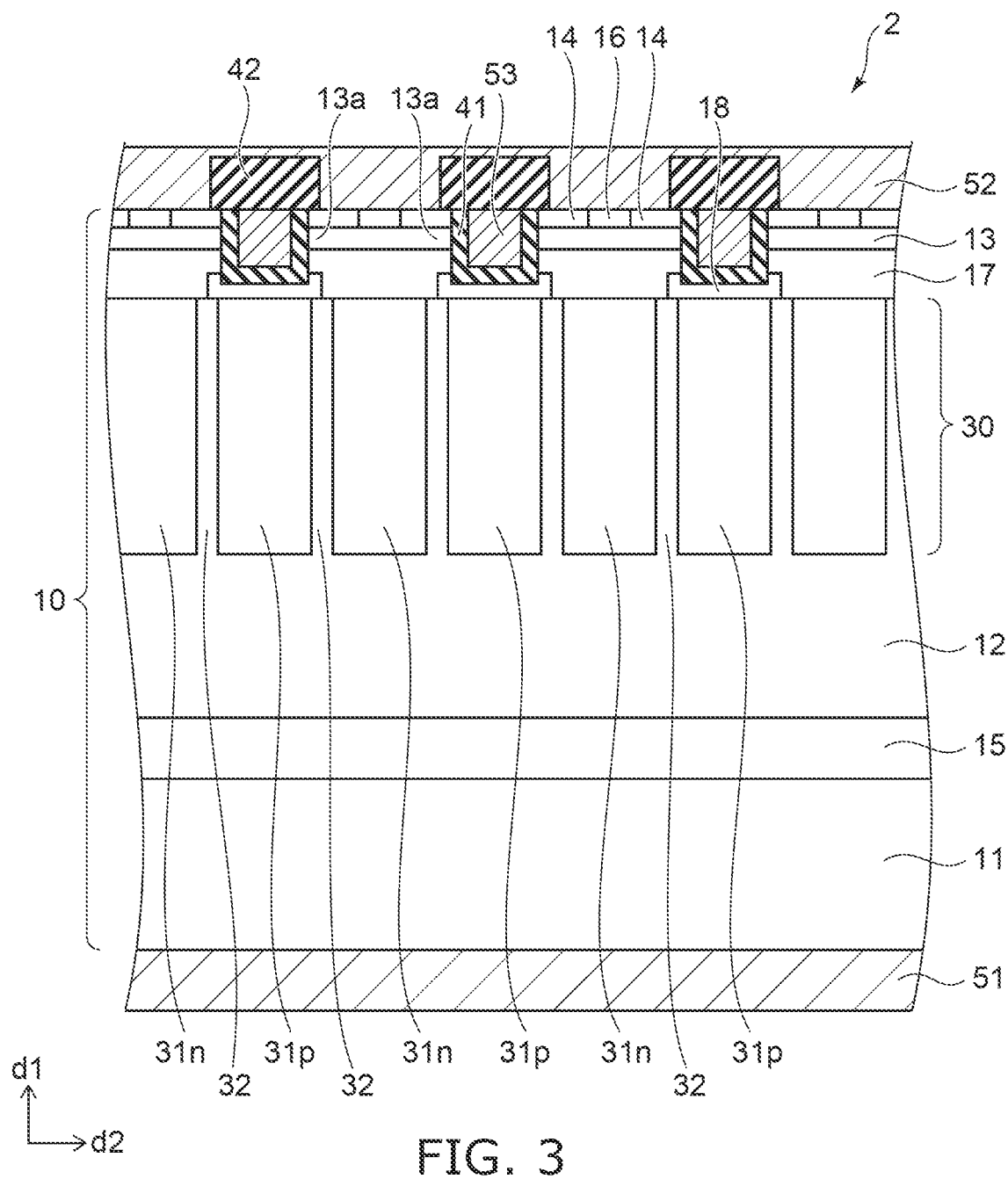
FIG. 3 is a schematic cross-sectional view of a semiconductor device of a second embodiment.

As shown in FIG. 3, a semiconductor device 2 of a second embodiment includes the gate electrode 53 that has a trench gate structure.

A p-type eighth layer 18 is located on the p-type pillar 31p. The n-type seventh layer 17 is located on the n-type pillar 31n and on the eighth layer 18. The upper end of the p-type pillar 31p contacts the eighth layer 18. The upper end of the n-type pillar 31n contacts the seventh layer 17. The third layer 13 is located on the seventh layer 17.

The gate electrode 53 is located, with the insulating film 41 interposed, in a trench that extends through the fourth, third, and seventh layers 14, 13, and 17 and reaches the eighth layer 18. An insulating film 42 is located between the gate electrode 53 and the second electrode 52.

In the on-operation, an inversion layer (an n-type channel) is formed in the channel region 13a of the third layer 13 facing the gate electrode 53 via the insulating film 41. The electron current flows between the fourth layer 14 and the n-type pillar 31n via the channel region 13a and the seventh layer 17.

Third Embodiment

Figure 4:
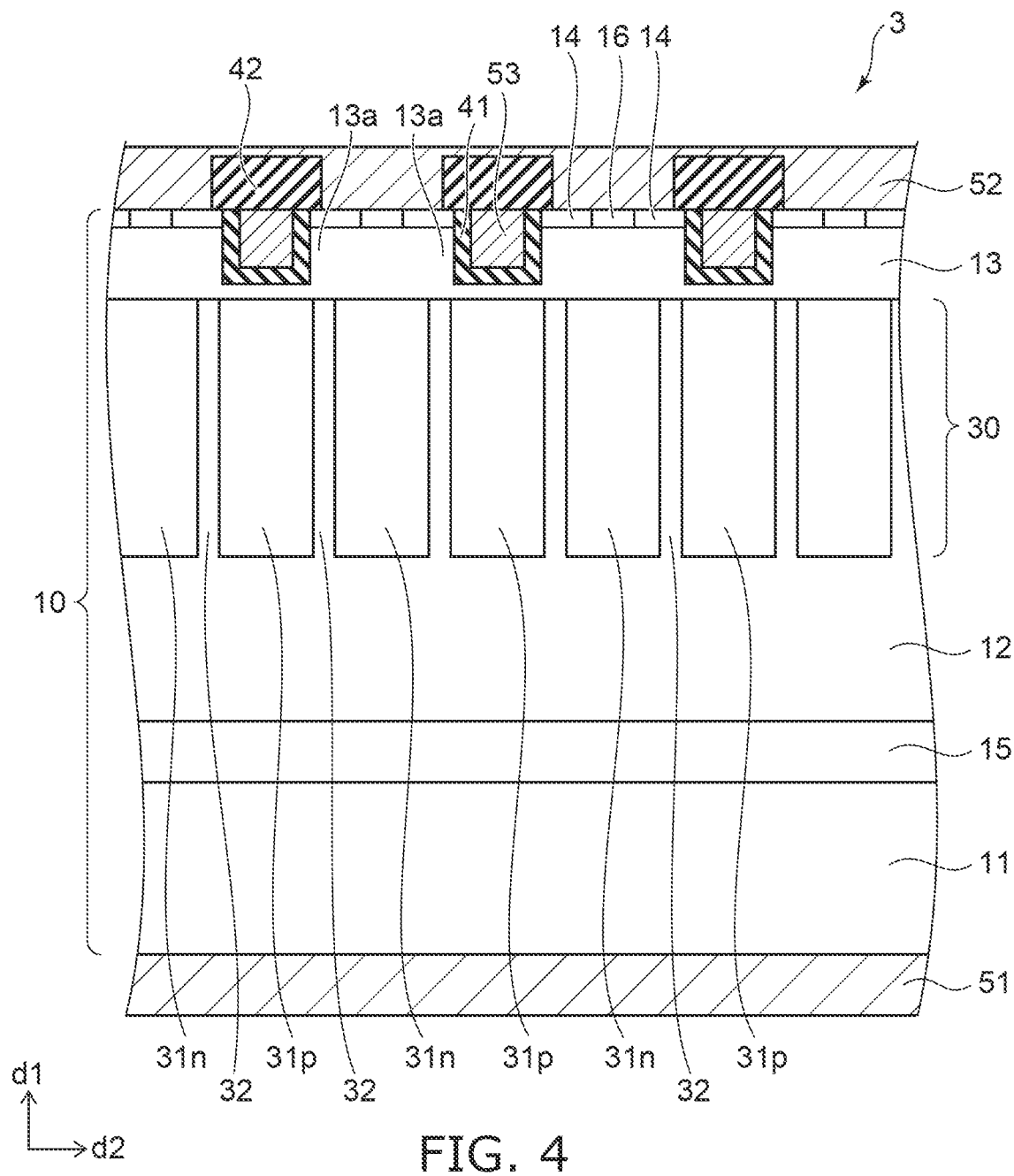
FIG. 4 is a schematic cross-sectional view of a semiconductor device of a third embodiment.

In a semiconductor device 3 of a third embodiment as shown in FIG. 4, the upper end of the n-type pillar 31n, the upper end of the p-type pillar 31p, and the upper end of the boundary region 32 contact the third layer 13 located on the super junction structure part 30.

The gate electrode 53 is located, with the insulating film 41 interposed, in a trench that is above the p-type pillar 31p, extends through the fourth layer 14, and reaches a depth partway through the third layer 13. In the on-operation, an inversion layer (an n-type channel) is formed in the channel region 13a of the third layer 13 facing the gate electrode 53 via the insulating film 41; and an electron current flows between the fourth layer 14 and the n-type pillar 31n via the channel region 13a.

Fourth Embodiment

Figure 5:
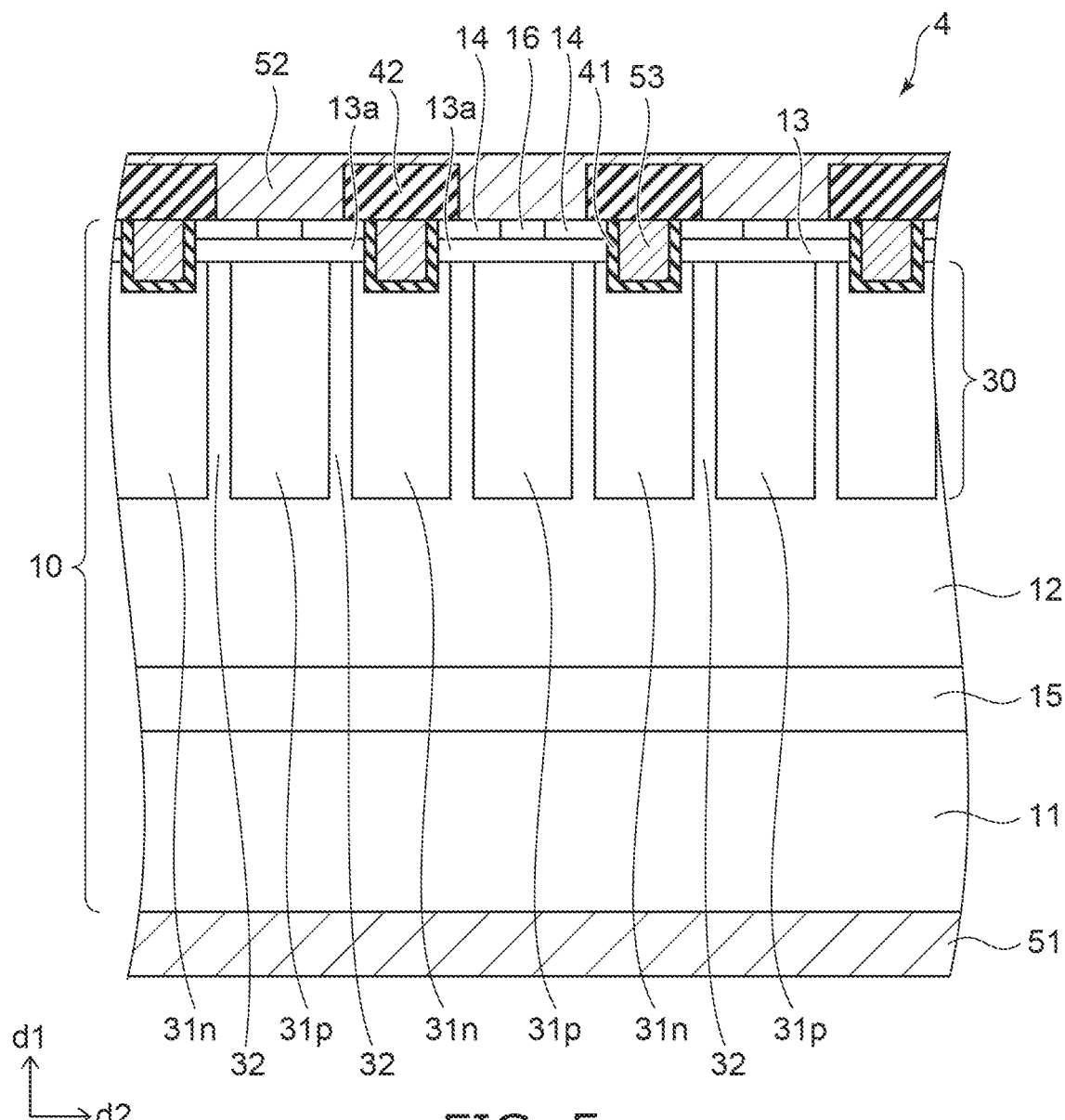
FIG. 5 is a schematic cross-sectional view of a semiconductor device of a fourth embodiment.

In a semiconductor device 4 of a fourth embodiment as shown in FIG. 5, the upper end of the n-type pillar 31n, the upper end of the p-type pillar 31p, and the upper end of the boundary region 32 contact the third layer 13 located on the super junction structure part 30.

The gate electrode 53 is located, with the insulating film 41 interposed, in a trench that extends through the fourth and third layers 14 and 13 and reaches the n-type pillar 31n. In the on-operation, an inversion layer (an n-type channel) is formed in the channel region 13a of the third layer 13 facing the gate electrode 53 via the insulating film 41; and an electron current flows between the fourth layer 14 and the n-type pillar 31n via the channel region 13a.

Fifth Embodiment

Figure 6:
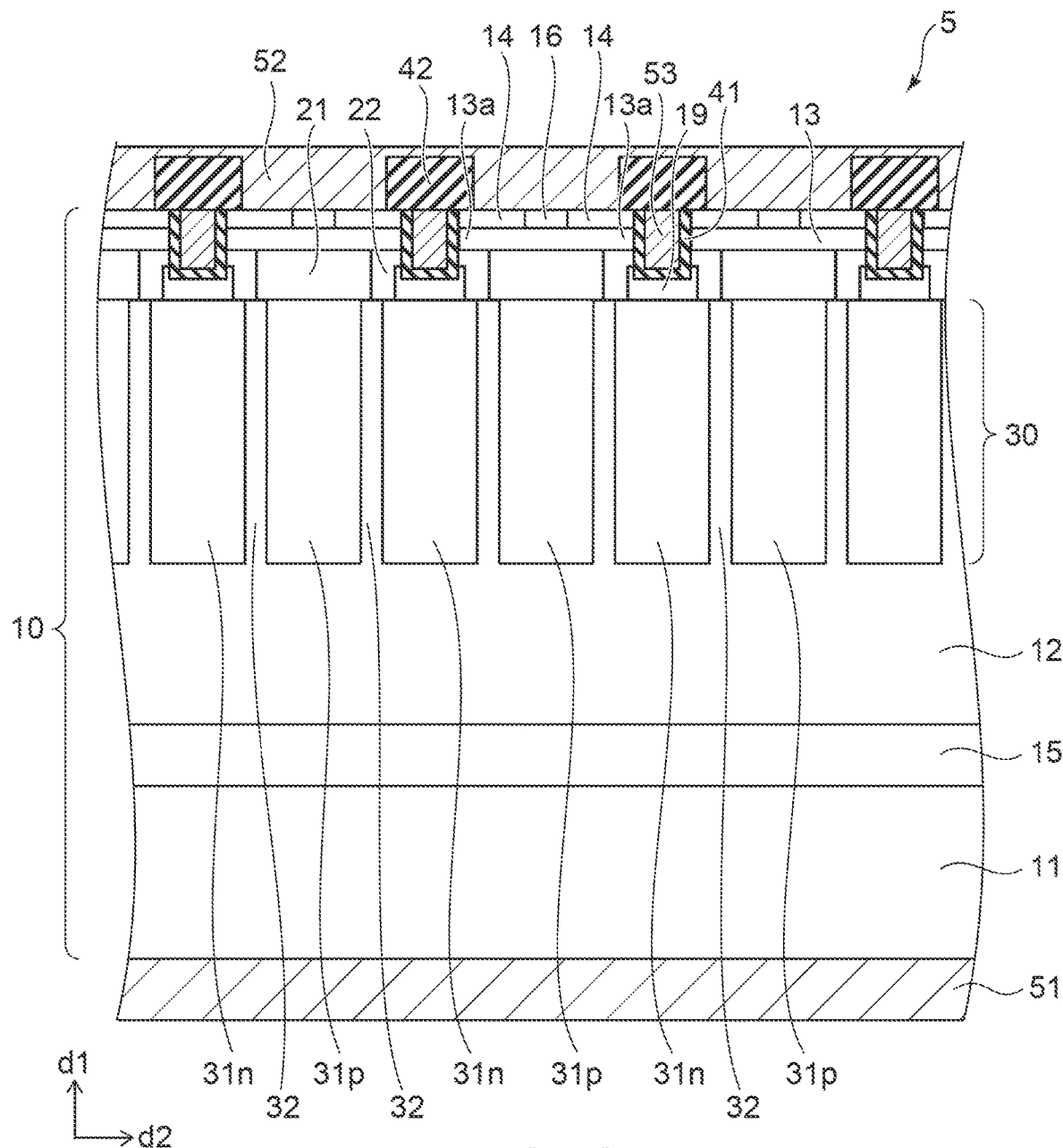
FIG. 6 is a schematic cross-sectional view of a semiconductor device of a fifth embodiment.

In a semiconductor device 5 of a fifth embodiment as shown in FIG. 6, a p-type ninth layer 19 is located on the n-type pillar 31n. Furthermore, an n-type eleventh layer 22 is provided on the n-type pillar 31n to cover the ninth layer 19. The upper end of the n-type pillar 31n contacts the ninth and eleventh layers 19 and 22. A p-type tenth layer 21 is located on the p-type pillar 31p. The upper end of the p-type pillar 31p contacts the tenth layer 21. The third layer 13 is located on the tenth layer 21 and on the eleventh layer 22.

The gate electrode 53 is located, with the insulating film 41 interposed, in a trench that extends through the fourth, third, and eleventh layers 14, 13, and 22 and reaches the ninth layer 19. In the on-operation, an inversion layer (an n-type channel) is formed in the channel region 13a of the third layer 13 facing the gate electrode 53 via the insulating film 41; and an electron current flows between the fourth layer 14 and the n-type pillar 31n via the channel region 13a and the eleventh layer 22.

Sixth Embodiment

Figure 7:
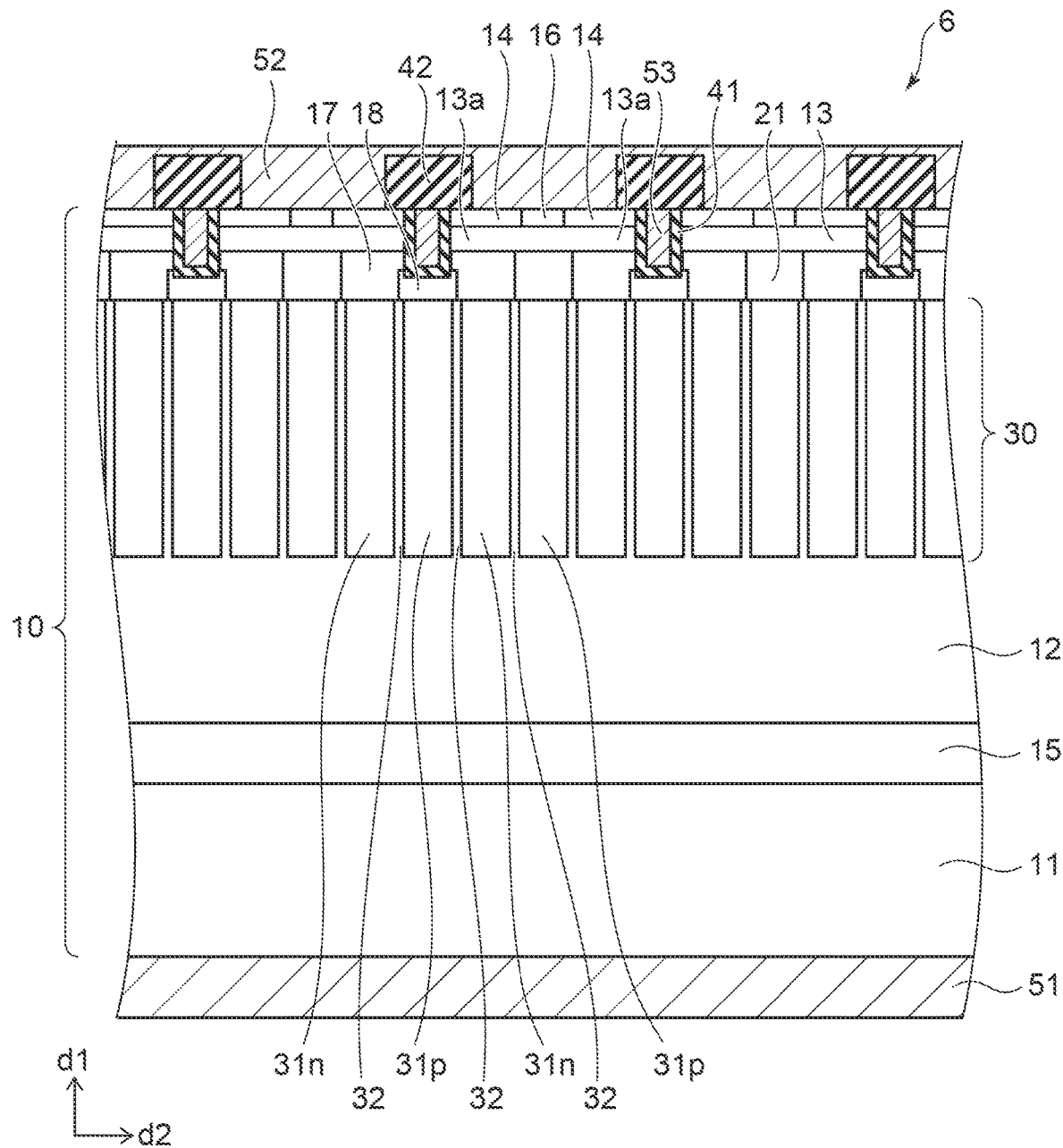
FIG. 7 is a schematic cross-sectional view of a semiconductor device of a sixth embodiment.

In a semiconductor device 6 of a sixth embodiment as shown in FIG. 7, the n-type seventh layer 17, the p-type eighth layer 18, and the p-type tenth layer 21 are located between the super junction structure part 30 and the third layer 13.

For example, the p-type pillar 31p on which the tenth layer 21 is located and the p-type pillar 31p on which the eighth layer 18 is located are alternately arranged in the second direction d2. The tenth layer 21 contacts the upper end of the p-type pillar 31p and the lower surface of the third layer 13. The seventh layer 17 is located on the n-type pillar 31n and covers the eighth layer 18.

The gate electrode 53 is located, with the insulating film 41 interposed, in a trench that extends through the fourth layer 14, the third layer 13, and a portion of the seventh layer 17 on the eighth layer 18 and reaches the eighth layer 18. In the on-operation, an inversion layer (an n-type channel) is formed in the channel region 13a of the third layer 13 facing the gate electrode 53 via the insulating film 41; and an electron current flows between the fourth layer 14 and the n-type pillar 31n via the channel region 13a and the seventh layer 17.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
   a first electrode;
   a second electrode; and
   a silicon carbide layer located between the first electrode and the second electrode in a first direction,
   the silicon carbide layer including:
      a first layer electrically connected with the first electrode, the first layer being of an n-type,
      a second layer located on the first layer, the second layer being of the n-type and having a lower impurity concentration than the first layer,
      a super junction structure part located on the second layer,
      a third layer located on the super junction structure part, the third layer being of a p-type, and
      a fourth layer located on the third layer and electrically connected with the second electrode, the fourth layer being of the n-type, and
   the super junction structure part including:
      a plurality of n-type pillars having higher impurity concentrations than the second layer,
      a plurality of p-type pillars having higher impurity concentrations than the second layer, and
      a boundary region positioned between the n-type pillar and the p-type pillar in a second direction orthogonal to the first direction, the boundary region extending in the first direction continuously from the second layer, the boundary region having a lower impurity concentration than the n-type pillars and the p-type pillars,
   an impurity concentration peak of the n-type pillar in the first direction and an impurity concentration peak of the p-type pillar in the first direction being adjacent to each other in the second direction via the boundary region.

2. The device according to claim 1, wherein the boundary region is of the n-type.

3. The device according to claim 1, wherein an upper end of the boundary region contacts the third layer.

4. The device according to claim 1, wherein at least one side surface among two side surfaces in the second direction of the n-type pillar does not include a portion contacting the p-type pillar.

5. The device according to claim 1, wherein at least one side surface among two side surfaces in the second direction of the p-type pillar does not include a portion contacting the n-type pillar.

6. The device according to claim 1, wherein the silicon carbide layer further includes a fifth layer located between the first layer and the second layer, the fifth layer being of the n-type and having a lower impurity concentration than the first layer and a higher impurity concentration than the second layer.

7. The device according to claim 1, wherein an n-type impurity concentration of the fourth layer is greater than an n-type impurity concentration of the n-type pillar.

8. The device according to claim 1, wherein in the first direction, the second layer and the n-type pillar contact each other, and the second layer and the p-type pillar contact each other.

9. The device according to claim 1, further comprising:
   a gate electrode located on the silicon carbide layer,
   the third layer including a channel region, the channel region facing the gate electrode via an insulating film.

10. The device according to claim 1, further comprising:
    a gate electrode reaching the third layer from an upper surface of the silicon carbide layer,
    the third layer including a channel region, the channel region facing the gate electrode via an insulating film.

11. The device according to claim 10, wherein the gate electrode is positioned above the p-type pillar.

12. The device according to claim 1, further comprising:
    a gate electrode extending through the third layer from an upper surface of the silicon carbide layer,
    the third layer including a channel region, the channel region facing the gate electrode via an insulating film.

13. The device according to claim 12, wherein the gate electrode is positioned above the p-type pillar.

14. The device according to claim 12, wherein the gate electrode is positioned above the n-type pillar.

15. The device according to claim 12, wherein the gate electrode reaches the n-type pillar.

16. The device according to claim 1, wherein a width in the second direction of the boundary region is constant in the first direction.

* * * * *